United States Patent [19]
Yoo et al.

[11] Patent Number: 5,703,811
[45] Date of Patent: Dec. 30, 1997

[54] DATA OUTPUT BUFFER CIRCUIT OF SEMICONDUCTOR MEMORY DEVICE

[75] Inventors: Seung-Moon Yoo; Jei-Hwon Yoo, both of Suwon, Rep. of Korea

[73] Assignee: Samsung Electronocs Co., Ltd., Suwon, Rep. of Korea

[21] Appl. No.: 580,546

[22] Filed: Dec. 29, 1995

[30] Foreign Application Priority Data

Dec. 29, 1994 [KR] Rep. of Korea ............... 1994/38507

[51] Int. Cl.$^6$ ................................................. G11C 13/00
[52] U.S. Cl. .......................... 365/189.05; 365/189.11; 327/321; 326/62
[58] Field of Search ..................... 365/189.11, 189.05; 327/321; 326/62

[56] References Cited

U.S. PATENT DOCUMENTS 4,678,950  7/1987  Mitake .................... 365/62 X
5,583,815  12/1996  Choi et al. ............. 365/189.05

*Primary Examiner*—Do Hyun Yoo
*Attorney, Agent, or Firm*—Cushman Darby & Cushman IP Group of Pillsbury Madison & Sutro LLP

[57] ABSTRACT

A voltage detection unit between a data output buffer terminal and the gate a transistor which is used to dissipate a high level voltage on the internal data line. The detection unit thus prevents an undesired electrical path from existing in the data output buffer circuit. In one embodiment, the detection unit consists of an NMOS and PMOS transistor connected in series and having a shared node connected to the voltage dissipating transistor. In another embodiment, there is also connected an invertor between the shared node and the gates of the NMOS and PMOS transistors.

23 Claims, 4 Drawing Sheets

DATA OUTPUT BUFFER CIRCUIT OF SEMICONDUCTOR MEMORY DEVICE

BACKGROUND OF THE INVENTION

The present invention relates to a semiconductor memory device, and more particularly to a data output buffer circuit having a negative voltage protecting circuit.

In general, semiconductor memory devices include a data output buffer circuit which outputs internal data to the exterior of the memory device, and a data input buffer circuit which inputs data from the exterior of the memory device. FIG. 1 shows the structure of a conventional data output buffer circuit and FIG. 2 shows a waveform illustrating operational characteristics of the data output buffer circuit shown in FIG. 1. Signal φTRST (hereinafter, it is referred to as an output reset signal φTRST) can cause a data output terminal DQ to change from a floating state (i.e. high impedance state) into an output state. When output reset signal φTRST is in a low state 21 as shown in FIG. 2, data output to a data output line DB is output as shown in 22 and data output to an inverse data output line /DB is output as shown in 23. When the output reset signal φTRST is input as a logic "low" state signal as shown in 21 of FIG. 2, NAND gates 11 and 12 of FIG. 1 output signals of logic "high" states, and inverters 13 and 14 respectively invert and output the signals output from the NAND gates 11 and 12. Since NMOS transistors 15 and 16 are both turned OFF, the data output terminal DQ of FIG. 1 maintains a high impedance state (generally, in a condition of 1.4 $V_{TRI}$ in case of transistor-transistor logic TTL), as shown in FIG. 2.

If the output reset signal φTRST is changed to a logic "high" state signal, the logic states of NAND gates 11 and 12 are determined in accordance with outputs of the data output lines DB and /DB. Accordingly, if a logic "high" state signal is received by the data line DB as shown in 22 of FIG. 2 and a logic "low" state signal is received by the inverse data line /DB as shown in 23 of FIG. 2, the NAND gate 11 outputs a logic "low" state signal and the NAND gate 12 outputs a logic "high" state signal. NMOS transistor 15, acting as an output transistor inputs the logic "high" states signal received from the inverter 13 at the gate electrode thereof and is turned ON. NMOS transistor 16 inputs the logic "low" state signal received from the inverter 14 at the gate electrode thereof to thereby be turned OFF. Accordingly, a logic "high" state signal is generated at the output terminal DQ as shown in 24 of FIG. 2. Reciprocally, if a logic "low" state signal is received by the data line DB and a logic "high" state signal is received by the inverted data line /DB, the NAND gate 11 outputs a logic "high" state signal and the NAND gate 12 outputs a logic "low" state signal. NMOS transistor 15, acting as an output transistor inputs the logic "low" state signal received from the inverter 13 at the gate electrode thereof and is turned OFF, and the NMOS transistor 16 inputs the logic "high" state signal received from the inverter 14 at the gate electrode thereof and is turned ON. Accordingly, a logic "low" state signal is generated at the output terminal DQ.

A conventional output terminal DQ of a data output buffer circuit constructed as described previously can be connected to the other memory components. While not connected to other data output buffer circuit components when the data input/output lines are isolated from each other typically on output terminal is shared by multiple data output buffer circuits (such as a×4 construction where 4 data output buffer circuits share a single output terminal.) FIG. 3 shows data output terminal DQ shared by two data output buffer circuits.

Data input and output on a common data line are distinguished according to the logic state of the output enable signal generated to an output enable (/OE: output enable) terminal. If a logic "low" state signal output enable signal is input to the output enable terminal, the data input/output line (DQ line) is used as a data output line. Then, the output reset signal φTRST which controls the data output buffer circuit signal φTRST can go to the logic "high" state. The logic state of the data output terminal DQ is then determined as described above according to the state of the internal data lines DB and /DB. Reciprocally, if the logic "high" state signal is input to the output enable terminal, the output reset signal φTRST goes to the signal logic "low" state, thereby changing the data output buffer circuit to a high impedance state (floating state), and the data input/output line (DQ line) is used as a data input line. When the data input buffer circuit which is connected in common to the data input/output lines is enabled, data is input to the data input/output line within the semiconductor memory device. While FIG. 3 shows two data output buffer circuits connected to the data input/output line (DQ line), FIG. 3, does not show the connection of the data input buffer circuit to the data input/output line. Further, the data input/output lines are connected to external devices, as described above, which external device may be structured with an interface having GTL, LVTTL or TTL structures.

When the negative voltage is used in the external device connected to the data input/output lines, current consumption greatly increases in the data output buffer circuit constructed as shown in FIG. 1. FIG. 4 shows the output terminal of the data output buffer circuit which is constructed as shown in FIG. 1, where the current is in the high impedance state. That is, the output reset signal φTRST is input at the logic "low" state and therefore NMOS transistors 15 and 16 are turned OFF. When a plurality of the data output buffers share a single data input/output line, selection of one of the data output buffer circuits has not occurred in this state, although the data input/output line may have been selected to perform an input function. If an undesired negative voltage is generated at the data output terminal DQ, an undesired electrical current path is formed. That is, when interfaced with external devices using a negative voltage, when the negative voltage flows to the data input/output line, the data output buffer circuit forms an undesired electrical current path. For example, if a negative voltage of −2V is input to the data output terminal DQ, 0V of a ground potential $V_{SS}$ level is applied to the gate electrode of the NMOS transistor 15, but the gate-source voltage Vgs goes to 2V since the source electrode is connected to the data output terminal DQ. Accordingly, the negative voltage applied to the data output terminal causes the NMOS transistor 15 of the data output buffer circuit to turn ON while in a high impedance state and forms the electrical current path shown in FIG. 4. Assuming that a threshold voltage $V_T$ of the NMOS transistor 15 is 1V and the power supply voltage $V_{CC}$ is 5V, Vgs−$V_T$ becomes smaller than the drain-source voltage Vds and NMOS transistor 15 operates in the saturation region.

If the data output buffer circuit undesirably operates in the high impedance state, electrical current is unnecessarily consumed which may adversely affect operation of the memory device, including operating power levels. FIG. 5 shows the operation state of the NMOS transistor 15 when it inputs a negative voltage to the data output terminal DQ. A channel illustrated by the hatched region is formed at the side of the source electrode, and in a region "c," where no channel is formed, a drift electrical current flows. The application of a negative voltage to the data output terminal DQ increases the voltage difference between the drain electrode and the source electrode, and therefore, in the region where the channel is not formed, impact ionization results and substrate current is substantially increases. As a result, the level of the substrate voltage $V_{BB}$ is increased, and due to this level change of the operating power, abnormal operations may result in the semiconductor memory device.

Another conventional data output buffer circuit which overcomes these problems is shown in FIG. 6 and is disclosed in detail in U.S. Pat. No. 4,678,950 to MITAKE. In the data output buffer circuit constructed as shown in FIG. 6, output data DT is applied from the data line DB to a NMOS transistor 64 acting as a pull-up transistor, and inverted output data DTB is applied from the inverted data line /DB to a NMOS transistor 66 acting as a pull-down transistor. A control signal $\phi$S causes the data output buffer circuit to enter the high impedance state. NMOS transistor 64 is connected between the power supply voltage $V_{CC}$ and the data output terminal DQ, and has its gate electrode connected to a node N1 to input output data DT. NMOS transistor 66 is connected between the data output terminal DQ and the ground potential $V_{SS}$, and has its gate electrode connected to node N2 to input output data DTB. NMOS transistor 61 is connected to the node N1 and has a gate which inputs output control signal $\phi$S. NMOS transistor 62 is connected between a source electrode of the NMOS transistor 61 and the ground potential $V_{SS}$, and has a gate connected to the data output terminal DQ. NMOS transistor 63 is connected between the node N1 and the data output terminal DQ, and has a gate connected to the ground potential $V_{SS}$. NMOS transistor 65 is connected between the node N2 and the ground potential $V_{SS}$, and has a gate which inputs the output control signal $\phi$S.

In operation, if the output control signal $\phi$S is input at the logic "high" state, NMOS transistors 61 and 65 are turned ON, thereby decreasing to ground level the potentials on the nodes N1 and N2. Thus, a logic "low" state signal is applied to gate electrodes of the NMOS transistors 64 and 66.

If the potential on node N1 was at the logic "high" state in the previous state, the data output terminal DQ would also be in a logic "high" state. In this state, if the output control signal $\phi$S is input as a logic "high" signal, NMOS transistor 61 turns ON, and, due to the "high" level logic potential on the data output terminal DQ, the NMOS transistor 62 is turned ON. Accordingly, the potential on the first node N1 becomes lower then the threshold voltage of the NMOS transistor 64. Conversely, if the potential on the node N2 was at a logic "high" level in the previous state, since the NMOS transistor 65 is turned ON upon receipt of the output control signal $\phi$S, the potential on the node N2 will change to potential lower than the threshold voltage of the NMOS transistor 66.

Once the NMOS transistors 64 and 66 are both turned OFF, the potential of the data output terminal DQ will fall to the logic "low" state and the data output buffer circuit described above enters a high impedance state. In the high impedance state, if a negative voltage is applied to the data output terminal DQ, since the voltage Vgs of NMOS transistor 64 is increased due to the negative voltage, the NMOS transistor 64 will momentarily turn ON. However, since the NMOS transistor 63, which is connected between the node N1 and data output terminal DQ, and has its gate electrode connected to ground potential $V_{SS}$ turned ON, the potential on the node N1 will change to the potential of the data output terminal DQ. Accordingly, since the potential on the node N1 equals the potential of the output terminal DQ, the voltage Vgs of the NMOS transistor 64 will go to 0V, thereby turning OFF the NMOS transistor 64. In other words, since the node N1 and the data output terminal DQ are linked with each other through a subthreshold region of the NMOS transistor 63, the voltage Vgs of the NMOS transistor 64 becomes 0V. Accordingly, since the electrical current path formed by the NMOS transistor 64 is cut off, abnormal operations due to impact ionization generated in the NMOS transistor 64 as shown in FIG. 5, can be prevented.

However, when using the data output buffer circuit having a negative voltage protecting unit as described above, desired electrical current path will still be formed if the memory device is connected in common with other memory devices as shown in FIG. 7. Referring to the operational waveform of FIG. 8, assume that a first memory and a second memory as shown in FIG. 7 respectively each include a data output buffer circuit constructed as shown in FIG. 6, share the data input/output lines of the system, and then output data using an interleave method. When data is output from the data output buffer circuit of the first memory, the second memory has to be in a high impedance state, and when data is output from the data output buffer circuit of the second memory, the data output buffer circuit of the first memory has to be in a high impedance state. In the operational waveform of FIG. 8, /RAS$_A$, /CAS$_A$, /OE$_A$ and $\phi$SA represent signals for controlling the first memory, and /RAS$_B$, /CAS$_B$, /OE$_B$ and $\phi$SB represent signals for controlling the second memory.

Assuming that the first memory is accessed, operation in which first output data DT is input as logic "low" state data and then changed to logic "high" state data will be explained hereinafter. If the /RAS$_A$ shown in 80 of FIG. 8, /CAS$_A$ shown in 82 and /OE$_A$ shown in 84 are enabled, thereby accessing the first memory, and inputting first output data DT is as logic "low" state data, the NMOS transistor 64 is turned OFF and the NMOS transistor 66 is turned ON, thereby generating the logic "low" state signal in the data output terminal DQ as shown in section LD1 of 88 of FIG. 8. When first output data DT is changed to a logic "high" state, first output data DT is input as logic "high" state data, the NMOS transistor 64 is turned ON and the NMOS transistor 66 is turned OFF, and therefore the voltage of the data output terminal DQA starts to increase as shown in a section HD1 of 88 of FIG. 8. In this state, if the accessing operation of the first memory is stopped and an accessing operation of the second memory is performed, /RAS$_A$, /CAS$_A$ and /OE$_A$ are disabled, and the $\phi$SA is changed to the signal of the logic "high" state. At the same time, /RAS$_B$, /CAS$_B$ and /OE$_B$ are enabled, and $\phi$SB is changed to logic "low" level signal. In this changed state, the logic "high" potential of the power supply voltage $V_{CC}$ level is applied to the node NA1 of the first memory, and the voltage of the data output terminal DQA starts to increase as shown in a section HD1 of 88 of FIG. 8. At this time, the first memory is changed to the high impedance state by the signal $\phi$SA applied to the transistors 61 and 62. Accordingly, the potential of the data output terminal DQA of the first memory starts to decrease again as shown in 88 of FIG. 8.

However, when the potential of the data output terminal DQA has not been sufficiently increased as shown in section HD1 of 88 of FIG. 8, since the transistors 61 and 62 have not yet sufficiently discharged the voltage of the node NA1, there is a possible undesired electrical current path shown by the dotted line in FIG. 7 according to the state of the second memory, since the node NA1 can undesirably remain high. This undesired electrical current path can exist because the voltage of the data output terminal DQA of the first memory is higher than the ground potential $V_{SS}$ as shown on 88 of FIG. 8 and is lower than the threshold voltage of the NMOS transistor 62. Since the path for discharging the voltage of the node NA1 is not formed in the first memory, the NMOS transistor 62 is turned OFF or is incompletely turned OFF. Since a logic "high" voltage level was generated at the node NA1 by first output data DT, the NMOS transistor 64 remains in the turned ON state.

In the state described above, if a logic "low" state signal is output to the data output terminal DQB from the second memory, the undesired electrical current path through the NMOS transistor 64 of the first memory and the NMOS transistor 76 of the second memory is formed. Accordingly, this undesired electrical current path remains until logic "high" state data is output to the data output terminal DQB from the second memory. Further, even if the node NA1 of the first memory is sufficiently discharged, when logic "low" state data is output through the data output terminal DQB of the second memory, the node NA1 will have a floating state. As a result, the voltage on node NA1 may undesirably change due to coupling or leaking currents and result in abnormal operation.

SUMMARY OF THE INVENTION

Accordingly, it is an object of the present invention to provide a data output buffer circuit in a semiconductor memory device capable of preventing abnormal operation due to a negative voltage applied to an output terminal of the data output buffer circuit.

It is another object of the present invention to provide a data output buffer circuit in a semiconductor memory device capable of stabilizing an output terminal to a high impedance state by detecting a level of the output voltage.

It is still another object of the present invention to provide a circuit capable of stably maintaining an output state in a stand-by state by detecting a voltage level of the data output terminal in a data output buffer circuit of a semiconductor memory device which shares data input/output lines with other semiconductor memory devices.

The present invention includes a voltage detection unit between a data output buffer terminal and the gate of a transistor which is used to dissipate a high level voltage on the internal data line. This detection unit thus prevents an undesired electrical path from existing due to the construction of the data output buffer circuit. In one embodiment, the detection unit consists of an NMOS and PMOS transistor connected in series and having a shared node connected to the voltage dissipating transistor. In another embodiment, there is also connected an invertor between the shared node and the gates of the NMOS and PMOS transistors.

BRIEF DESCRIPTION OF THE DRAWINGS

A more complete appreciation of the invention, and many of the attendant advantages thereof, will be readily apparent and will become better understood by reference to the following detailed description of the invention considered in conjunction with the accompanying drawings in which like reference symbols indicate the same or similar components, wherein.

DETAILED DESCRIPTION OF THE PREFERRED EMBODIMENT

The term "output control signal $\phi S$" used in the present invention represents a signal for rendering a data output buffer circuit to a high impedance state. The terms "first output data DT" and "second output data DTB" (also called output data DT and inverted output data DTB) represent data output from data lines DL and /DL, respectively. In a high impedance state an output terminal of the data output buffer circuit is floating to present a very high impedance to the data buffer output terminal.

Figure 9:
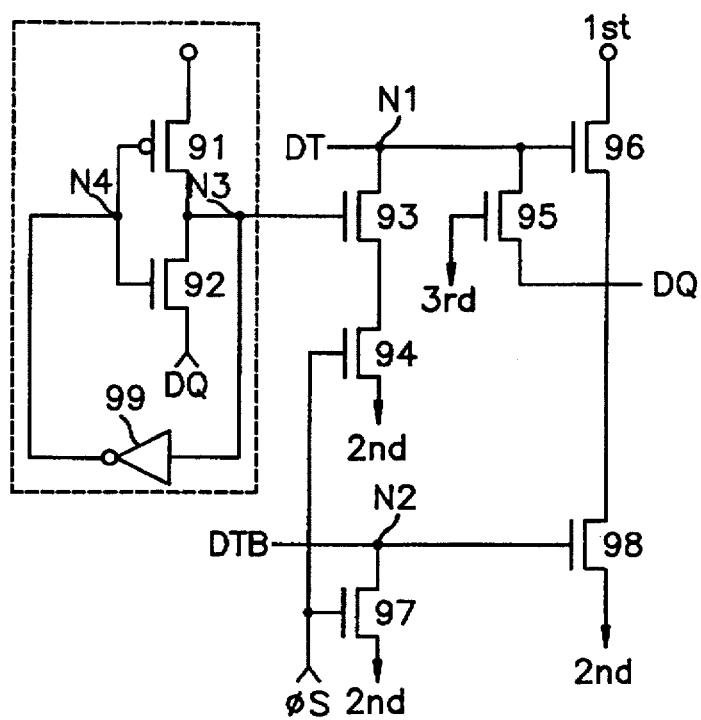
FIG. 9 is a circuit diagram illustrating a first embodiment of a data output buffer circuit according to the present invention.

Referring now to FIG. 9, output data DT is data input from a data line DB, and inverted data DTB is data input from the data line /DB. The control signal $\phi S$ causes the data output buffer circuit to enter a high impedance state. NMOS transistor 96 is connected between the power supply voltage $V_{CC}$ and data output terminal DQ and has a gate electrode which is connected to a first node N1 that inputs output data DT. NMOS transistor 96 is a switching unit that performs a pull-up function of the voltage on the data output terminal DQ. NMOS transistor 98 is connected between the data output terminal DQ and the ground potential $V_{SS}$, and has a gate electrode which is connected to a second input node N2 that input the inverted output data DTB. NMOS transistor 98 is a switching unit that performs a pull-down function of the voltage on the data output terminal DQ. NMOS transistor 95 is connected between the first input node and the data output terminal DQ, and has a gate electrode connected to the ground voltage $V_{SS}$. NMOS transistor 95 is a third switching unit that cuts off an electrical current path formed through the NMOS transistor 96 when a negative voltage is input to the data output terminal DQ.

PMOS transistor 91 is connected between the power supply voltage $V_{CC}$ and a first connection node N3, and has a gate electrode connected to a second connection node N4. NMOS transistor 92 is connected between the first connection node N3 and the data output terminal DQ, and has a gate electrode connected to the second connection node N4. An inverter 99 is connected between the first connection node N3 and the second connection node N4, and is tripped in accordance with a voltage level of the data output terminal DQ detected at the first connection node N3 to thereby control the voltage level of the second connection node N4. The PMOS transistor 91, the NMOS transistor 92 and the inverter 99 are voltage detection units which detect the voltage level of the data output terminal DQ to thereby output the detected result to the first connection node N4.

NMOS transistor 93 is connected to the first input node N1, and has a gate electrode connected to the first connection node N3. NMOS transistor 94 is connected between a source electrode of the NMOS transistor 93 and the ground potential $V_{SS}$, and has a gate electrode which inputs the output control signal φS. NMOS transistors 93 and 94 are fourth switching units which cut off the electrical current path of the NMOS transistor 96 according to the voltage level detected at the data output terminal DQ in the high impedance state. The NMOS transistor 97 is connected between the second input node N2 and the ground potential $V_{SS}$, and has a gate electrode which inputs the output control signal φS.

If the output control signal φS is input at a logic "high" state, the NMOS transistors 94 and 97 are turned ON. Since the first connection node N3 is precharged to the power supply voltage $V_{CC}$ during an initial state, the NMOS transistor 93 is turned ON and, accordingly, the potential levels of the first input node N1 and the second input node N2 are lowered to ground potential level. As a result, a logic "low" state signal is applied to the gate electrodes of the NMOS transistors 96 and 98. Accordingly, in a normal state, with a "high" logic level φS signal, the data output terminal DQ maintains the ground potential $V_{SS}$ level. Therefore, the ground potential $V_{SS}$ is applied to the data output terminal DQ, and accordingly the voltage of the connection node N3 is continuously maintained to the logic "high" level. Inverter 99 inverts the voltage of the connection node N3 to thereby apply an inverted voltage to the second connection node N4. PMOS transistor 91 therefore maintains a turned-ON state and the NMOS transistor 92 maintains a turned-OFF state, thereby maintaining the voltage of the first input node N1 at the logic "low" level.

When a negative voltage is applied to the data output terminal DQ in the high impedance state, the first input node N1 and the second connection node N4 maintain ground potential $V_{SS}$. Accordingly, all the NMOS transistors 96, 95 and 92 are turned ON. If the NMOS transistor 92 is turned ON, the potential of the connection node N3 is lowered by the negative voltage. As a result, if the voltage input to the inverter 99 is lower than the trip voltage, the inverter 99 outputs a logic "high" state signal. PMOS transistor 91 is thus turned OFF by the output of the inverter 99, thereby cutting off the electrical current path formed in the PMOS transistor 91 and the NMOS transistor 92. As a result, the potential of the connection node N3 goes to the logic "low" state, and NMOS transistor 93 is completely turned OFF. At this time, NMOS transistor 95 performs the operations as described previously. Thus, the voltage of the first input node N1 is maintained under the threshold voltage of the NMOS transistor 96 due to the resistance that results from NMOS transistors 93, 94 and 95. Accordingly, when a negative voltage is applied to the data output terminal DQ, no electrical current path is formed through the NMOS transistor 96.

Figure 1:
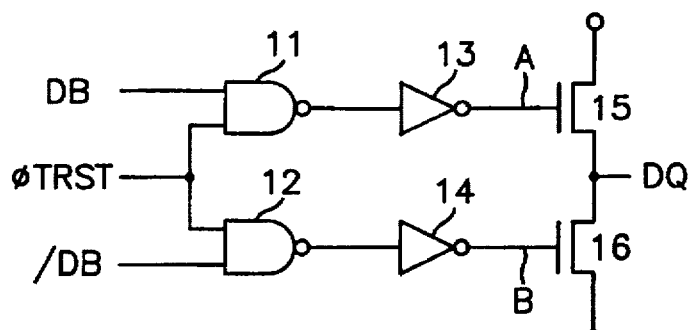
FIG. 1 is a circuit diagram illustrating a conventional data output buffer circuit.
Figure 2:
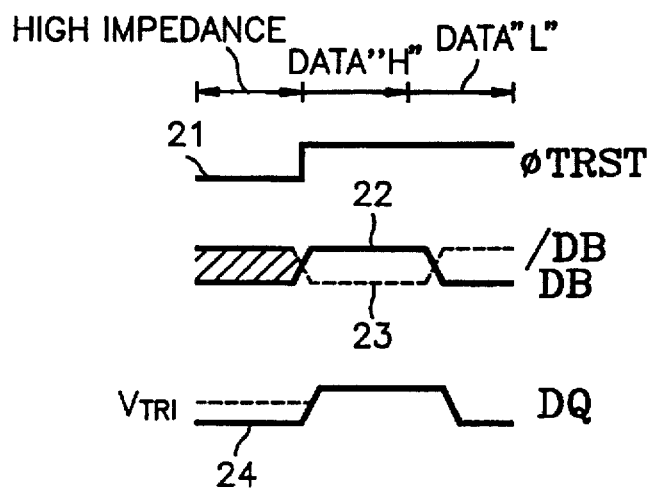
FIG. 2 shows a waveform illustrating operational characteristics of the conventional data output buffer circuit illustrated in FIG. 1.
Figure 3:
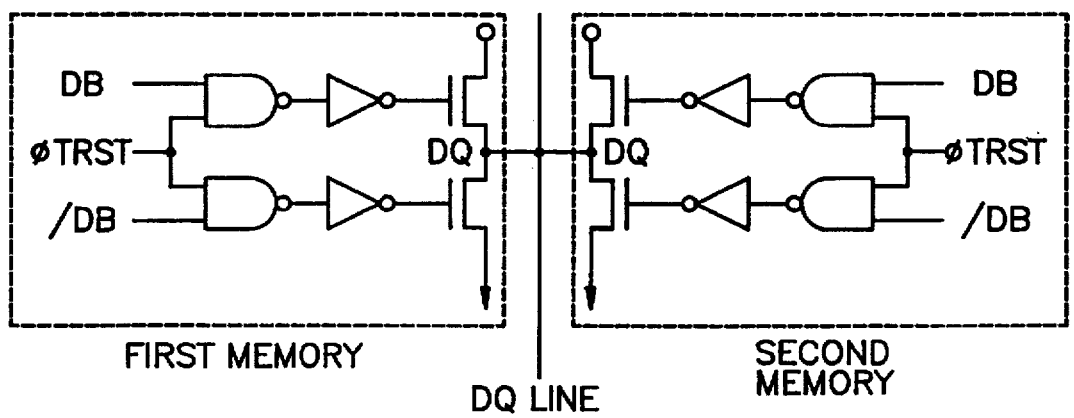
FIG. 3 is a circuit diagram illustrating two output terminals of semiconductor memory devices connected to a common data output line.
Figure 4:
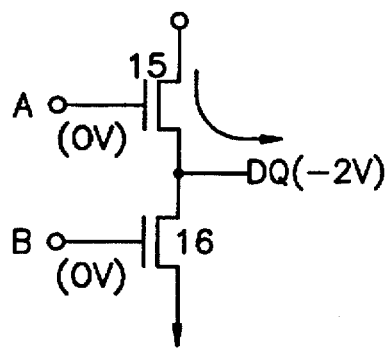
FIG. 4 is a view illustrating an electrical current path by a negative voltage in the data output buffer circuit constructed as shown in FIG. 1.
Figure 5:
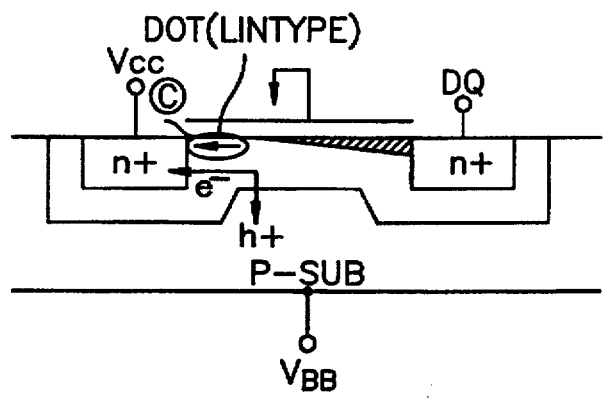
FIG. 5 is a circuit diagram illustrating an undesired electrical current path that can form in the NMOS transistor 15 of FIG. 4.
Figure 6:
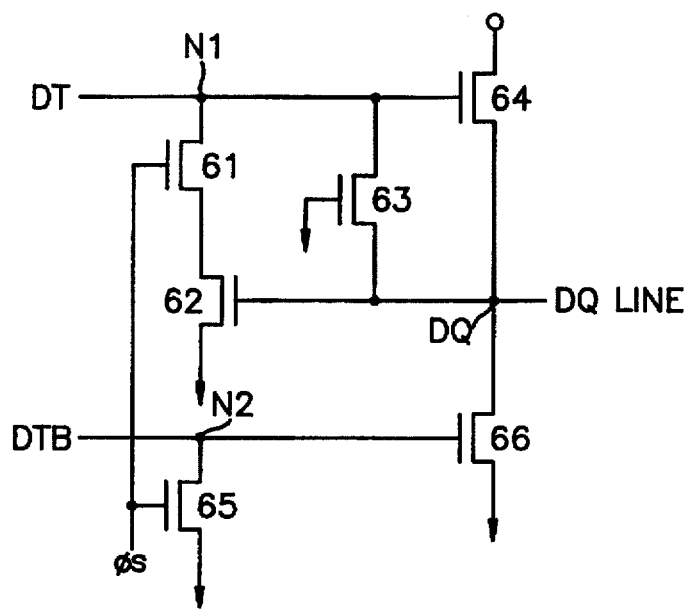
FIG. 6 is a circuit diagram illustrating another conventional data buffer circuit which overcomes some of the disadvantages of the data output buffer circuit shown in FIG. 1.
Figure 7:
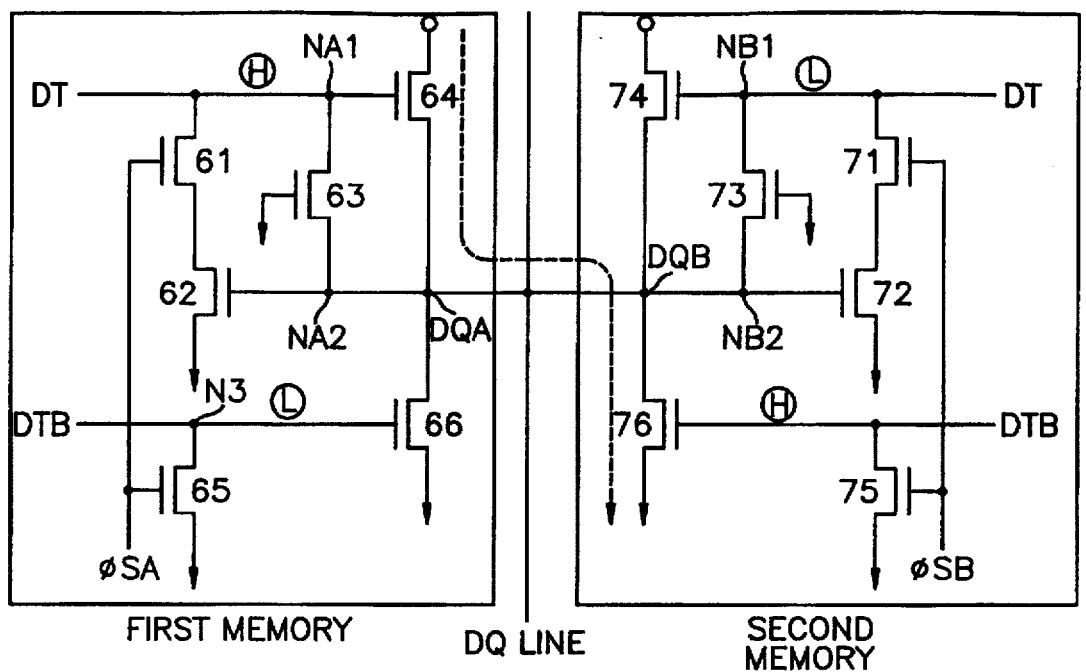
FIG. 7 is a circuit diagram illustrating an undesired electrical current path that can form when multiple data output buffer circuits shown in FIG. 6 are connected to a common data output line.
Figure 8:
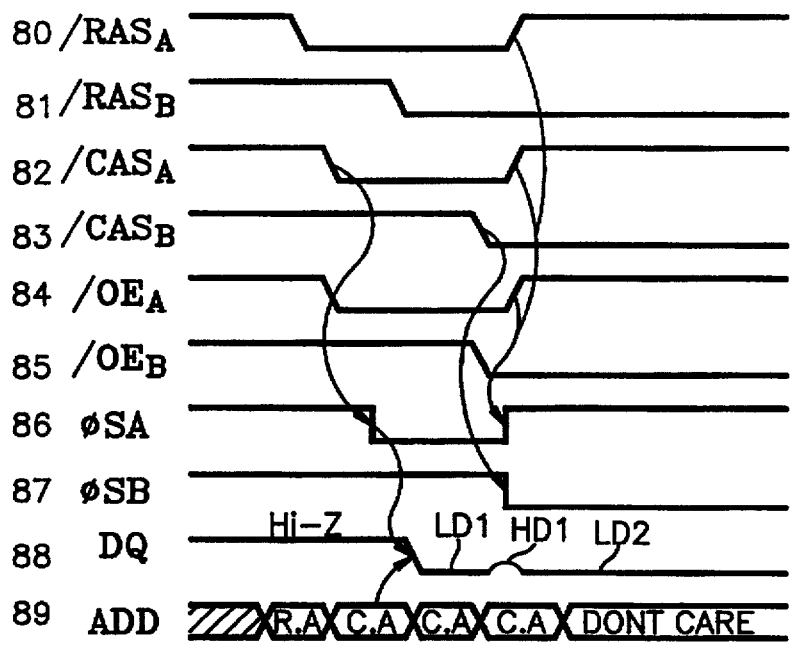
FIG. 8 shows a waveform illustrating the operational characteristics of the FIG. 7 circuit which can result in the generation of undesired electrical current path illustrated in FIG. 7.

When a plurality of data output buffer circuits share a data input/output line, the operation previously described with reference to the prior art will be redescribed with reference to the present invention. In this operation, first output data DT is output as logic "high" state data and then changed to the high impedance state. A voltage rise on the data output, such as illustrated at HD1 of 88 of FIG. 8 is generated. The voltage on the data output terminal DQ is a positive voltage having a voltage level higher than the ground voltage $V_{SS}$ and lower than the threshold voltage. Since the connection node N3 has been precharged to the power supply voltage $V_{CC}$ level, the NMOS transistor 93 becomes the turned-ON state. Further, the NMOS transistor 94 is turned ON by the output control signal φS. Accordingly, an electrical current resulting from output data DT signal of the logic "high" level at the first input node N1 from the previous state flows through the NMOS transistors 93 and 94. Thus, the voltage on the first input node N1 rapidly changes to ground potential $V_{SS}$. Accordingly, the NMOS transistor 96 is turned OFF, and an undesired electrical current path is not formed through the NMOS transistor 96. As a result, the data output buffer circuit is not affected by the output state of other memories commonly connected to that data input/output line.

Accordingly, in the data output buffer circuit as previously described, when the voltage on the data output terminal DQ is a ground potential $V_{SS}$ level or is generated as a positive voltage in the high impedance state, the voltage of the input node N1 can always be maintained at the ground potential level. When the voltage on the data output terminal DQ is a negative voltage, by causing the voltage on the input node N1 to be equal to the voltage on the data output terminal DQ, an undesired electrical current path is not formed in the high impedance state and, accordingly, excess current consumption can be prevented. Furthermore, by controlling the input node N1 so it is not in a floating state, abnormal operations can be prevented.

Figure 10:
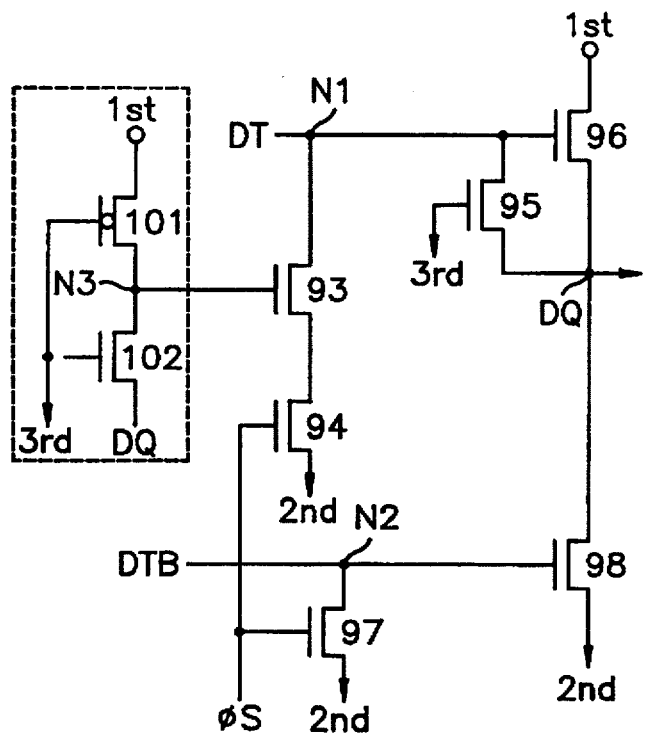
FIG. 10 is a circuit diagram illustrating a second embodiment of a data output buffer circuit according to the present invention.

FIG. 10 shows another embodiment of the data output buffer circuit constructed according to the present invention. In FIG. 10, the components except for the output voltage detection unit are constructed as shown in FIG. 9. The output voltage detection unit is embodied by a PMOS transistor 101 and an NMOS transistor 102. PMOS transistor 101 is connected between the power supply voltage $V_{CC}$ and connection node N3 and has a gate electrode connected to the ground potential $V_{SS}$. NMOS transistor 102 is connected between the connection node N3 and the data output terminal DQ, and has a gate electrode connected to the ground potential $V_{SS}$.

This embodiment detects the output voltage of the data output terminal DQ in the high impedance state as follows. If the voltage level of the data output terminal DQ is at a ground potential $V_{SS}$ level, the PMOS transistor 101 maintains a turned-ON state, thereby maintaining the voltage level of the input node N1 at the ground potential $V_{SS}$ level. Further, even when the output voltage of the data output terminal DQ is generated as a positive voltage, the voltage of the connection node N3 is maintained at the logic "high" level, thereby maintaining the first input node N1 at the ground level. Even when a negative voltage is applied to the data output terminal DQ, the NMOS transistor 102 is turned ON and, therefore, the voltage level of the connection node N3 is changed to the DQ level. Accordingly, NMOS transistor 93 is turned OFF, and therefore the voltage level of the first input node N1 is equal to the voltage level of the data output terminal DQ due to the presence of the NMOS transistor 95. Accordingly, the data output buffer circuit of FIG. 10 operates the same as the data output buffer circuit of FIG. 9.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A data output buffer circuit of a semiconductor memory device which shares data input/output lines with other semiconductor memory devices, said circuit comprising:

a first input node which receives an output data signal;

a second input node which receives an inverted output data signal;

an output node for outputting a buffer output data signal having an output voltage, said buffer output data signal derived from said output data signal and said inverted output data signal;

a pull-up circuit connected between a first voltage and said output node, said pull-up circuit being controlled by said output data signal;

a pull-down circuit connected between said output node and a second voltage, said pull-down circuit being controlled by said inverted output data signal;

a voltage detection circuit connected between said first voltage and said output node, said voltage detection circuit inputting said buffer output data signal, detecting an output voltage level of said output voltage, and producing a detected voltage signal; and a switch circuit connected between said first input node and said second voltage, said switch circuit including a switch input which receives said detected voltage signal.

2. The data output buffer circuit according to claim 1, wherein said voltage detection circuit comprises:

a first MOS transistor connected between said first voltage and said switch input, said first MOS transistor including a first gate electrode;

a second MOS transistor connected between said switch input and said output node, said second MOS transistor including a second gate electrode; and a control circuit having a control input connected to said switch input and a control output connected to said first and second gate electrodes, said control circuit generating a control output signal at said control output, said control output signal having a control output voltage level that controls said first and second MOS transistors and which is dependent on said output voltage level detected by said voltage detection circuit.

3. The data output buffer circuit according to claim 1 wherein said switch circuit includes first and second transistors serially connected between said first input node and said second voltage, said first transistor having a first gate electrode connected to said switch input and said second transistor having a second gate electrode connected to an output control signal.

4. The data output buffer circuit according to claim 2 wherein said switch circuit includes first and second transistors serially connected between said first input node and said second voltage, said first transistor having a first gate electrode connected to said switch input and said second transistor having a second gate electrode connected to an output control signal.

5. The data output buffer circuit according to claim 2, wherein:

said pull-up circuit comprises a pull-up transistor having a pull-up gate electrode controlled by said output data signal;

said pull-down circuit comprises a pull-down transistor having a pull-down gate electrode controlled by said inverted output data signal; and said first voltage is a power supply voltage and said second voltage is a ground potential.

6. The data output buffer circuit according to claim 4, wherein:

said pull-up circuit comprises a pull-up transistor having a pull-up gate electrode controlled by said output data signal;

said pull-down circuit comprises a pull-down transistor having a pull-down gate electrode controlled by said inverted output data signal; and said first voltage is a power supply voltage and said second voltage is a ground potential.

7. The data output buffer circuit according to claim 2, wherein said first MOS transistor is a PMOS transistor, said second MOS transistor is an NMOS transistor and said control circuit includes an inverter having a trip point that sets a predetermined voltage that will cause a change in logic state of said control output signal.

8. The data output buffer circuit according to claim 5, wherein said first MOS transistor is a PMOS transistor, said second MOS transistor is an NMOS transistor and said control circuit includes an inverter having a trip point that sets a predetermined voltage that will cause a change in logic state of said control output signal.

9. The data output buffer circuit according to claim 6, wherein said first MOS transistor is a PMOS transistor, said second MOS transistor is an NMOS transistor and said control circuit includes an inverter having a trip point that sets a predetermined voltage that will cause a change in logic state of said control output signal.

10. The data output buffer circuit according to claim 1, wherein said voltage detection circuit comprises:

a first MOS transistor connected between said first voltage and said switch input, said first MOS transistor including a first gate electrode connected to said second voltage; and a second MOS transistor connected between said switch input and said output node, said second MOS transistor including a second gate electrode connected to said second voltage.

11. The data output buffer circuit according to claim 10 wherein said first MOS transistor is a PMOS transistor and said second MOS transistor is an NMOS transistor.

12. A data output buffer circuit of a semiconductor memory device which shares data input/output lines with other semiconductor memory devices, said circuit comprising:

a first input node which receives an output data signal;

a second input node which receives an inverted output data signal;

an output node for outputting a buffer output data signal having an output voltage, said buffer output data signal derived from said output data signal and said inverted output data signal;

a pull-up circuit connected between a first voltage and said output node, said pull-up circuit being controlled by said output data signal;

a pull-down circuit connected between said output node and a second voltage, said pull-down circuit being controlled by said inverted output data signal;

a first switch circuit connected between said first input node and said output node, said first switch circuit being controlled by a third voltage;

a voltage detection circuit connected between said first voltage and said output node, said voltage detection circuit inputting said buffer output data signal, detecting an output voltage level of said output voltage, and producing a detected voltage signal, said voltage detection circuit including:

a first MOS transistor connected between said first voltage and a switch input, said first MOS transistor including a first gate electrode;

a second MOS transistor connected between said switch input and said output node, said second MOS transistor including a second gate electrode; and an inverter having a control input and a control output, said control output connected to said first and second gate electrodes, said inverter generating a control output signal at said control output, said control output signal having a control output voltage level that controls said first and second MOS transistors and which is dependent on a trip point that sets a predetermined voltage that will cause a change in logic state of said control output signal; and a second switch circuit connected between said first input node and said second voltage, said second switch circuit being connected to said switch input and to said control input of said voltage detector circuit.

13. The data output buffer circuit according to claim 12 wherein said voltage detection circuit controls an electrical current path of said pull-up circuit using said first and second switch circuits when a negative voltage exists on said output node and using said first switch circuit when a voltage exists on said output node that is higher than said third voltage.

14. The data output buffer circuit according to claim 13 further including a third switch circuit connected between said second input node and said second voltage, said third switch circuit being controlled by an output control signal.

15. The data output buffer circuit according to claim 13, wherein:

said pull-up circuit comprises a pull-up transistor having a pull-up gate electrode controlled by said output data signal;

said pull-down circuit comprises a pull-down transistor having a pull-down gate electrode controlled by said inverted output data signal; and said first voltage is a power supply voltage and said second voltage is a ground potential.

16. The data output buffer circuit according to claim 14, wherein each of said first, second and third switching circuits comprise at least one NMOS transistor.

17. A data output buffer circuit of a semiconductor memory device which shares data input/output lines with other semiconductor memory devices, said circuit comprising:

a first input node which receives an output data signal;

a second input node which receives an inverted output data signal;

an output node for outputting a buffer output data signal having an output voltage, said buffer output data signal derived from said output data signal and said inverted output data signal;

a pull-up circuit connected between a first voltage and said output node, said pull-up circuit being controlled by said output data signal;

a pull-down circuit connected between said output node and a second voltage, said pull-down circuit being controlled by said inverted output data signal;

a first switch circuit connected between said first input node and said output node, said first switch circuit being controlled by a third voltage;

a voltage detection circuit connected between said first voltage and said output node, said voltage detection circuit inputting said buffer output data signal, detecting an output voltage level of said output voltage, and producing a detected voltage signal, said voltage detection circuit including:

a first MOS transistor connected between said first voltage and a switch input, said first MOS transistor including a first gate electrode connected to said third voltage; and a second MOS transistor connected between said switch input and said output node, said second MOS transistor including a second gate electrode connected to said third voltage; and a second switch circuit connected between said first input node and said second voltage, said second switch circuit being connected to said switch input of said voltage detection circuit.

18. The data output buffer circuit according to claim 17 wherein said voltage detection circuit controls an electrical current path of said pull-up circuit using said first and second switch circuits when a negative voltage exists on said output node and using said first switch circuit when a voltage exists on said output node that is higher than said third voltage.

19. The data output buffer circuit according to claim 18 further including a third switch circuit connected between said second input node and said second voltage, said third switch circuit being controlled by an output control signal.

20. The data output buffer circuit according to claim 19, wherein:

said pull-up circuit comprises a pull-up transistor having a pull-up gate electrode controlled by said output data signal;

said pull-down circuit comprises a pull-down transistor having a pull-down gate electrode controlled by said inverted output data signal; and said first voltage is a power supply voltage and said second voltage is a ground potential.

21. The data output buffer circuit according to claim 20, wherein each of said first, second and third switching circuits comprise at least one NMOS transistor.

22. The data output buffer circuit according to claim 17, wherein said third voltage is a ground potential level.

23. The data output buffer circuit according to claim 17, wherein said third voltage is an arbitrary reference voltage level.

* * * * *